United States Patent [19]

Nishizawa

[11] Patent Number: 4,811,443

[45] Date of Patent: Mar. 14, 1989

[54] APPARATUS FOR WASHING OPPOSITE SURFACES OF A SUBSTRATE

[75] Inventor: Hisao Nishizawa, Shiga, Japan

[73] Assignee: Dainippon Screen Mfg. Co., Ltd., Japan

[21] Appl. No.: 121,607

[22] Filed: Nov. 17, 1987

[30] Foreign Application Priority Data

Nov. 28, 1986 [JP] Japan .................. 61-285395

[51] Int. Cl.⁴ .................. B08B 0/1; G03F 0/1
[52] U.S. Cl. .................. 15/97.1; 15/102
[58] Field of Search .................. 15/97 R, 102, 21 R

[56] References Cited

U.S. PATENT DOCUMENTS 4,109,337 8/1978 Hillman et al. .

FOREIGN PATENT DOCUMENTS 0020088 12/1980 European Pat. Off. ............. 15/97 R 59-8352 3/1984 Japan .

*Primary Examiner*—Edward L. Roberts
*Attorney, Agent, or Firm*—Ostrolenk, Faber, Gerb & Soffen

[57] ABSTRACT

An apparatus for washing and wiping both surfaces of a substrate includes a pair of juxtaposed cleaning disks of a porous elastic material with a disk-shaped wiping member on each disk. A substrate requiring cleaning is inserted between the disks and one of the disks is rotated to produce relative rotation which is effective for cleaning/wiping the substrate. A cleaning-liquid supply alternately supplies a cleaning liquid to one and then to the other of the substrate to sequentially wash the opposite surfaces of the substrate. While one of its sides is being washed, the other side of the substrate, which is not being supplied with the cleaning liquid, is drawn against the other disk by suction pressure or the like.

12 Claims, 2 Drawing Sheets

APPARATUS FOR WASHING OPPOSITE SURFACES OF A SUBSTRATE

FIELD OF THE INVENTION AND RELATED ART STATEMENT

The present invention relates to an apparatus for washing opposite surfaces of, for example, a semiconductor substrate, a glass substrate for a photomask, or the like (hereinafter referred to as "a substrate" generically).

Heretofore, for example, an apparatus such as is shown in FIG. 2 has been known for washing the opposite surfaces of substrates. (Reference is made to Japanese Utility Model Application Kokoku No. 59-8352.)

The known apparatus is constituted by a pair of cleaning disks 102 and 102 (only one of which is depicted), and a pair of substrate transfer arms 118 and 118. The cleaning disks 102 and 102 supports a respective one of a pair of disk-like wiping members 103 and 103, which are in opposite relationship with each other and arranged to rotate with the cleaning disks 102 and 102.

The pair of substrate transfer arms 118 and 118 are arranged to pick up the substrates 101 one by one from the substrate accommodating cassette 100 by sandwiching each substrate between the arms 118. The substrates 101 are then sequentially transferred by the arms 118 into and out of a gap between the opposite surfaces of the respective wiping members 103 and 103. Wiping members 103 and 103 are made of a sponge material and have a spiral groove 103a formed in each of the respective opposing surfaces thereof which grooves 103a extend substantially radially from a central portion toward the circumference of the surface. While a cleaning liquid is supplied into the respective spiral grooves 103a and 103a through rotary shafts 107 and 107 of the respective cleaning disks 102 and 102 being rotated, the substrate 101 held by the substrate transfer arms 118 and 118 is inserted between the opposite surfaces of the respective wiping members 103 and 103 so that the opposite surfaces of the substrate 101 are washed simultaneously.

However, the conventional example apparatus illustrated above is constructed such that the substrate 101 is held at its portion 1a by the substrate transfer arms 118 and 118 while the opposite surfaces thereof are being washed. This poses the problem that the held portions 1a of the substrate 101 remains unwashed.

SUMMARY OF THE INVENTION

It is therefore an object of the present invention to solve the above described problems encountered in the prior art.

It is another object of the invention to provide an apparatus for washing opposite surfaces of a substrate in which it is not necessary to hold substrate by a substrate transfer arms during washing of the substrate.

In order to attain the foregoing objects, the apparatus for washing opposite surfaces of a substrate according to the present invention comprises a pair of cleaning disks made of a porous elastic material and respectively provided with disk-like wiping members relatively rotatably disposed in close opposite relationship with each other, and a cleaning-liquid supply means for supplying a cleaning liquid alternately onto opposite surfaces of the substrate mounted between the opposite surfaces of the respective wiping members, so that the opposite surfaces of the substrate are washed alternately by the wiping members while being held by one of the wiping members which is not being supplied with the cleaning liquid.

Preferably, the apparatus further comprises a pressure reducing means for selectively applying negative pressure onto the opposite surfaces of the substrate so that the substrate is attracted to and held by one wiping member which is not being supplied with the cleaning liquid during washing of the substrate.

The washing apparatus according to the present invention is arranged such that a pair of cleaning disks are provided which rotate relative to each other, and a cleaning liquid is supplied alternately to the opposite surfaces of a substrate mounted between the respective opposite surfaces of wiping members of the respective cleaning disks, so that the opposite surfaces of the substrate are alternately washed one after one while the substrate is held by the wiping member which is not being supplied with the cleaning liquid. Accordingly, it is not necessary to hold the substrate during washing unlike the conventional washing mode. Therefore, the problem of the held portions which remain unwashed is solved.

Where the apparatus includes pressure reducing means to attract and held by one of the opposite wiping members which is not being supplied with the cleaning liquid, the substrate can be held by a greater holding force.

BRIEF DESCRIPTION OF THE DRAWINGS

The above and other objects, features, and advantages of the present invention will be more apparent from the following description which refer to the accompanying drawings, in which.

DETAILED DESCRIPTION OF THE PREFERRED EMBODIMENTS

Figure 1:
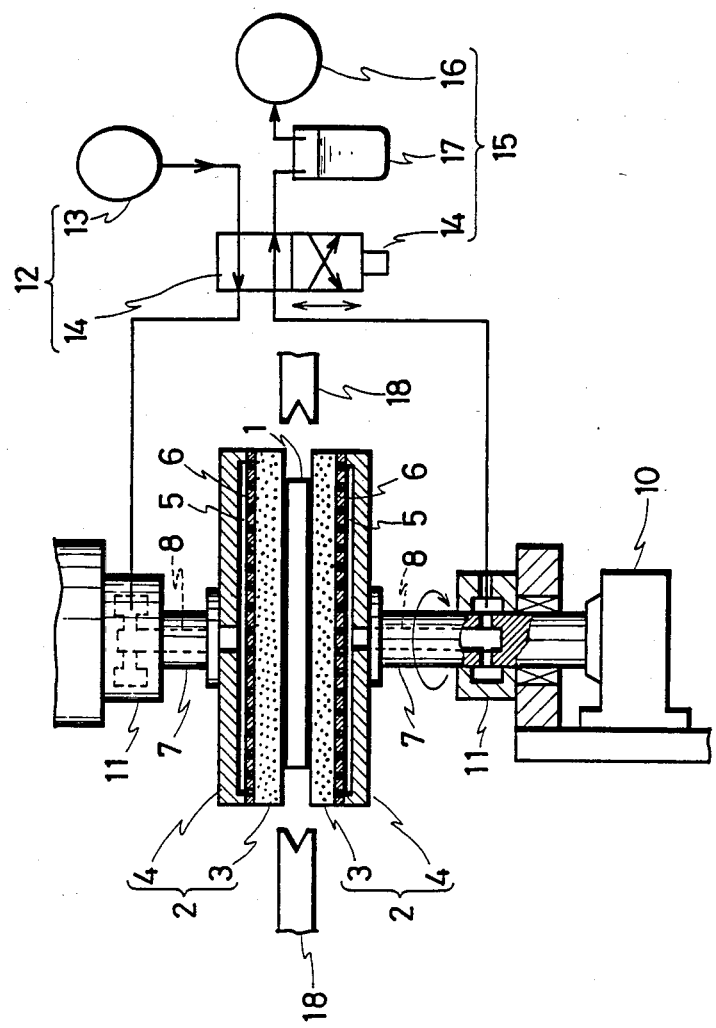
FIG. 1 is a schematic diagram showing, in longitudinal section, a main portion of an embodiment of an apparatus for washing opposite surfaces of a substrate according to the present invention.

FIG. 1 is a cross section of a main portion of the apparatus for washing opposite surfaces of a substrate according to the present invention.

The washing apparatus includes a pair of cleaning disks 2 and 2 each of which comprises a disk-like wiping member 3, the wiping members 3 being closely juxtaposed to each other and relatively rotatable. A juxtaposed cleaning-liquid supply device 12 alternately supplies a cleaning liquid onto the opposite surfaces of a substrate 1 mounted between the opposite surfaces of the wiping members 3 and 3, and a pressure reducing device 15 selectively applies a negative pressure onto one or the other of the opposite surfaces of substrate 1. The cleaning disks 2 and 2 are juxtaposed and each includes one of a pair of: base disks 4 and 4 whose surfaces face one another and are recessed to form respective cleaning-liquid communication chambers 5 and 5; porous plates 6 and 6 which cover the communication chambers 5 and 5 of their base disks 4 and 4; wiping members 3 and 3 made of a porous sponge material and fixed on the surfaces of respective porous plates 6 and 6; and support shafts 7 and 7 for pivotally supporting its respective base disks 4 and 4. The support shafts 7 and 7 respectively have a liquid path 8 for leading the cleaning liquid into the respective communication chambers 5. A driving motor 10 is connected to one of the support shafts 7 (the lower support shaft in FIG. 1) so as to rotate the driven one of the pair of cleaning disks 2 and 2 relative to the stationary other disk. Joints 11 and 11 lead the cleaning liquid into the liquid paths 8 in the support shafts 7 respectively.

The cleaning-liquid supply device 12 is constituted by a cleaning-liquid supply source 13 for supplying a cleaning liquid such as pure water or the like, and an electromagnetic switching valve 14 for alternately connecting one or the other of the pair of joints 11 and 11 to the cleaning-liquid supply source 13 so that the opposite surfaces of the substrate 1 mounted between the opposite surfaces of the respective wiping members 3 and 3 are alternately supplied with the cleaning liquid.

The pressure reducing device 15 is comprised of a negative-pressure source 16 such as a vacuum pump or the like and the electromagnetic switching valve 14. The pair of joints 11 and 11 are thus alternately connected to the negative-pressure source 16 through an exhaust liquid drain 17. When one of the surfaces of substrate 1 is supplied with the cleaning liquid, negative pressure is exerted onto the other surface of substrate 1 and, in this manner, the substrate 1 is attracted to and held by the wiping member 3 corresponding to the other surface.

Referring to FIG. 1 again, the operation of the aforementioned washing apparatus is as follows.

First, substrate 1 is mounted between the opposite surfaces of the wiping members 3 and 3 by means of the substrate transfer arms 18 and 18. Next, the electromagnetic switching valve 14 of the cleaning liquid supply device 12 is operated to the position shown in FIG. 1. Consequently, the upper surface of the substrate 1 is supplied with the cleaning liquid through the wiping member 3 of the upper cleaning disk 2 while the lower surface of the substrate 1 is attracted to and held by the other wiping member of the lower cleaning disk 2. Subsequently, the driving motor 10 is actuated to rotate the lower cleaning disk 2. This causes the upper surface of the substrate 1 to be wiped and cleaned.

After completion of washing of the upper surface of the substrate 1, the electromagnetic switching valve 14 is switched so that the lower surface of the substrate 1 is supplied with the cleaning liquid through the wiping member 3 of the lower cleaning disk 2 while the upper surface of the substrate 1 is attracted to and held by the wiping member 3 of the upper cleaning disk 2. At that time, lower cleaning disk 2 is rotated, so that the lower surface of the substrate 1 is wiped and cleaned.

Thereafter, substrate 1 is taken out of the wiping members 3 and 3 by means of the substrate transfer arms 18 and 18, and another substrate is mounted between the wiping members 3 and 3. The operation described above is repeated as necessary to process a desired number of substrates sequentially.

The present invention is not limited to the embodiment described above. Many modifications can be made.

For example, where the substrates are small and light in weight, the pressure reduction device is not always necessary, because such a substrate can be held solely by means of the wiping member which is not being supplying the cleaning liquid with holding force due to friction without the use of any negative pressure source whatsoever.

If it is necessary to mount a substrate vertically or slantingly, the pair of cleaning disks may be disposed vertically or slantingly at the right and left sides.

Figure 2:
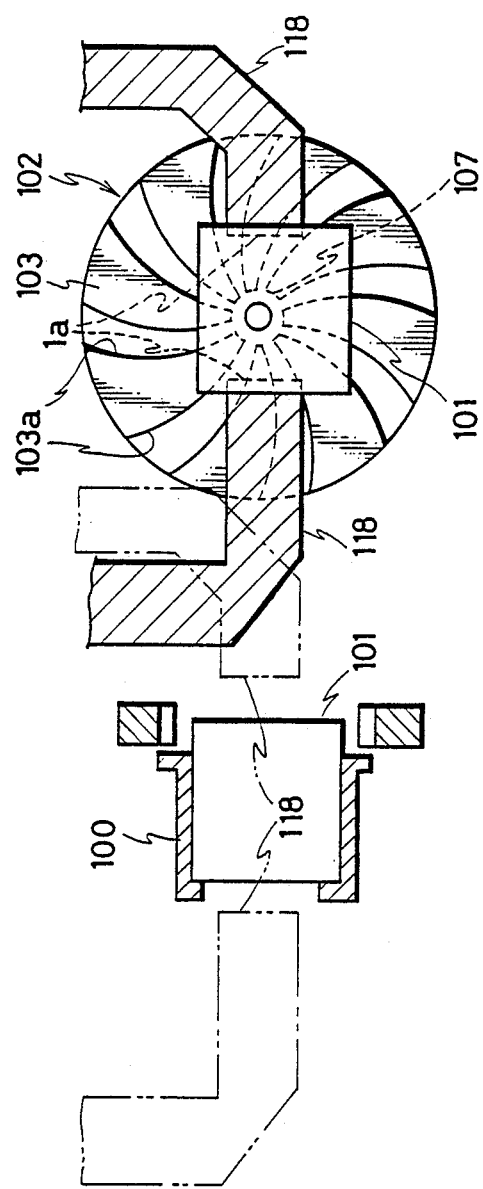
FIG. 2 is a schematic view of an example of the conventional apparatus described above.

Instead of the electromagnetic valve of the cleaning-liquid supply device, individual opening/closing valves may be separately provided in the paths from the respective joints to the cleaning-liquid supply device so that the opening/closing of the valves can be changed over separately from each other. Further, the wiping members 3 and 3 may be arranged to enable the gap between the wiping members 3 and 3 to be expanded so that a substrate 1 may be loaded between the wiping members 3 and 3 by any conveying device other than by the above-described substrate transfer arms. Furthermore, the upper wiping member 3 in FIG. 1 may have its own driving motor, so that the opposite wiping members 3 and 3 are rotated simultaneously and in opposite directions. Moreover, as in the conventional apparatus of FIG. 2, sprial grooves may be provided on opposite surfaces of the wiping members 3 and 3, so as to supply cleaning liquid such as pure water to a central portion of the grooves.

While preferred embodiments of the present invention have been described above, it should be understood that various modifications may be made without departing from the spirit and scope of the invention which is defined in the appended claims.

What is claimed is:

1. A washing apparatus for substrates, comprising:
   a first disk, and a second disk juxtaposed to the first disk, each of said disks having a respective, generally flat, first surface, the first surfaces of the disks facing one another and effective for accommodating a substrate to be washed therebetween;
   means for rotating at least one of the disks for producing relative rotation between the first surfaces of the disks; and
   means for supplying a cleaning liquid to the first surface of the first disk while holding the substrate at the second disk and thereafter supplying a cleaning liquid to the first surface of the second disk while holding the substrate at the first disk.

2. The apparatus of claim 1, further comprising a respective wiping member disposed at each of the first surfaces of the disks.

3. The apparatus of claim 2, further comprising spiral grooves provided at said wiping members for channeling a cleaning liquid therewith.

4. The apparatus of claim 1, wherein the disks are comprised of a porous elastic material.

5. The apparatus of claim 1, further comprising means for producing a negative pressure at said first surfaces of said disks and wherein said substrate is selectively holdable at either of said first surfaces by said negative pressure.

6. The apparatus of claim 1, wherein said first surfaces extend horizontally.

7. The apparatus of claim 1, wherein a substrate to be cleaned has first and second sides and wherein said first surface of said first disk is disposed to lie flat against said first side of said substrate and said first surface of said second disk against said second side of said substrate.

8. The apparatus of claim 1, further comprising means for sequentially transferring substrates to and from between the first surfaces of the disks.

9. The apparatus of claim 8, wherein said transferring means comprises first and second arms for holding a substrate.

10. The apparatus of claim 1, further comprising a first shaft for supporting said first disk and a second shaft for supporting said second disk and a respective fluid path in each of said first and second shafts.

11. The apparatus of claim 10, further comprising a motor coupled to the first shaft for rotating the first disk.

12. The apparatus of claim 1, further comprising a cleaning liquid source, a negative pressure source, and a switching valve coupled between the cleaning liquid source and the negative pressure source, on one hand, and said first and second disks, on the other hand, said switching valve being effective for alternatingly and mutually exclusively connecting said cleaning liquid source and said negative pressure source to said first and second disks.

* * * * *